(12) United States Patent
Anderson et al.

(10) Patent No.: US 6,398,631 B1
(45) Date of Patent: Jun. 4, 2002

(54) METHOD AND APPARATUS TO PLACE WAFERS INTO AND OUT OF MACHINE

(75) Inventors: Gary L. Anderson, St. Ann; Judy Schmidt, St. John; Brent Teasley, Silex; Dennis Buese, O'Fallon, all of MO (US); James Callahan, Bethalto; Randy Gene Loeschen, O'Fallon, both of IL (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/681,160

(22) Filed: Feb. 2, 2001

(51) Int. Cl.⁷ .............................................. B24B 47/02
(52) U.S. Cl. .................... 451/339; 451/388; 451/398; 438/692
(58) Field of Search .................. 451/339, 388, 451/335, 331, 332, 333, 283, 285, 287, 288, 289, 460, 398, 41; 438/691, 692

(56) References Cited

U.S. PATENT DOCUMENTS

| 4,944,119 A | | 7/1990 | Gill, Jr. et al. | |
|---|---|---|---|---|
| 5,498,199 A | | 3/1996 | Karlsrud et al. | |
| 5,527,209 A | | 6/1996 | Volodarsky et al. | |
| 5,762,543 A | * | 6/1998 | Kasprzyk et al. | 451/339 |
| 5,882,248 A | * | 3/1999 | Wright et al. | 451/388 |
| 5,899,801 A | | 5/1999 | Tolles et al. | |
| 5,916,015 A | * | 6/1999 | Natalicio | 451/388 |
| 5,952,242 A | | 9/1999 | Pietsch et al. | |
| 6,083,090 A | * | 7/2000 | Bamba | 451/398 |
| 6,113,490 A | * | 9/2000 | Hakomori | 451/388 |
| 6,139,408 A | * | 10/2000 | Hakomori | 451/398 |
| 6,149,498 A | * | 11/2000 | Van Kessel et al. | 451/339 |
| 6,283,827 B1 | * | 9/2001 | Vogtmann et al. | 451/288 |
| 6,305,677 B1 | * | 10/2001 | Lenz | 451/388 |

* cited by examiner

Primary Examiner—Joseph J. Hail, III
Assistant Examiner—Hadi Shakeri
(74) Attorney, Agent, or Firm—Senniger, Powers, Leavitt & Roedel

(57) ABSTRACT

A system for facilitating transfer of a semiconductor wafer into or out of a wafer carrier of a polishing or lapping machine without contacting a face of the wafer. The system includes a wafer transport suitable for placement above the carrier, the transport having at least one open cavity with a size and shape suitable for registering alignment with an opening of the carrier. The cavity and opening together form a compartment adapted to receive and hold the wafer. A liquid delivery conduit having an outlet located above an abrading member of the machine is arranged to deliver a liquid to a position generally beneath the transport. A method for transferring the wafer to or from the machine includes delivering liquid beneath the wafer. The wafer thereby moves between a first position resting on the abrading member and a second position spaced above the abrading member where a tool may engage the edge of the wafer for holding the wafer without contacting the face of the wafer.

29 Claims, 6 Drawing Sheets

METHOD AND APPARATUS TO PLACE WAFERS INTO AND OUT OF MACHINE

BACKGROUND OF THE INVENTION

This invention relates generally to semiconductor wafer processing, and in particular to a method and apparatus for inserting or extracting a wafer from a machine while avoiding contact damage on the wafer.

Semiconductor wafers are generally prepared from a single crystal ingot, such as a silicon ingot, which is sliced into individual wafers. Each wafer is subjected to a number of processing operations to facilitate the installation of integrated circuit devices and to improve their yield, performance, and reliability. Typically, these operations reduce the thickness of the wafer, remove damage caused by the slicing operation, and create a flat and highly reflective facial surface. Lapping and chemical-mechanical polishing are two of these operations. Lapping involves rubbing a face of the wafer relative to a lapping plate while dispensing an abrasive slurry to remove material and embedded damage by mechanical abrasion. Chemical-mechanical polishing involves rubbing the face relative to a polishing pad, such as a polyurethane impregnated polyester felt, while dispensing a slurry containing both an abrasive and chemicals so that both mechanical action and chemical reaction contribute to the removal of material.

To maximize throughput, a lapping or polishing operation is typically accomplished using a machine that simultaneously holds between 15 and 30 wafers. Each machine has several wafer carriers which move relative to a rotating, abrasive surface of a lapping plate or polishing pad to effect a relative rubbing motion. Each carrier typically includes three or more openings for receiving wafers and guiding motion of the wafers relative to the surface. Some machines have two abrasive surfaces for simultaneous processing of top and bottom faces. To begin a lapping or polishing operation, unpolished wafers are initially transferred from a container such as a cassette and inserted into the openings of the carrier. Afterwards, each wafer is removed from its corresponding opening in the carrier and transferred to a second cassette for transport or delivery.

Unfortunately, the wafer handling steps associated with lapping and polishing operations can degrade wafer quality and yield. Each wafer is easily damaged by contact during transfer, especially after polishing when the wafer surfaces are especially reactive and vulnerable to contamination. Any contact carries the risk of smudges, scratches, or contamination damage. Accordingly, devices for handling the wafer, such as manual gripping tools, preferably contact edges only and avoid contact with faces. Removal of the wafer from a polishing pad without damage is especially difficult because a film of slurry underneath the wafer creates a strong adhering, capillary force which holds the wafer to the polishing pad. Also, the edge of the wafer is not easily accessible for engagement by an edge handling tool. Accordingly, the wafer is removed by contacting the face of the wafer with a vacuum-type gripping tool, such as a vacuum pencil, which has a tube through which suction is applied and a rubber tip that engages the face. Contact of the tip against the face degrades wafer quality, leaving a residual impression that is frequently noticeable on finished wafers. Placing a new wafer on to the polishing pad also may damage the wafer. The entire lower face of the wafer should seal against the pad, which requires some downward force on the wafer. Often, operators use a gloved finger or thumb to press down on the wafer so that it seals. That can break the wafer or cause contamination. Additionally, the steps of placing and removing wafers are time-consuming and expensive.

BRIEF SUMMARY OF THE INVENTION

Among the several objects and features of the present invention may be noted the provision of an apparatus and method for inserting and removing a semiconductor wafer from a machine while avoiding contact with a face of the wafer; the provision of such an apparatus and method that minimize damage and contamination; the provision of such an apparatus and method that are either manual or automated; the provision of such an apparatus and method which do not require substantial modification of the lapping or polishing machines; and the provision of such an apparatus and method that are rapid and economical in operation.

Briefly, a system according to the present invention facilitates transfer of a semiconductor wafer into or out of a machine for removing material from the wafer. The machine has a wafer carrier for holding the wafer and for guiding motion of the wafer relative to an underlying abrading member while a face of the wafer engages the abrading member. The wafer carrier includes at least one opening for receiving the wafer, the opening having an outer rim that generally circumscribes a peripheral edge margin of the wafer. The system comprises a wafer transport suitable for placement above the wafer carrier of the machine. The transport has a top surface, a bottom surface, and at least one open cavity therethrough with an internal edge wall. The cavity has a size and shape suitable for registering alignment with at least one opening of the wafer carrier when the edge wall of the cavity is positioned above the outer rim of the opening and the bottom surface rests on the wafer carrier. The cavity and opening together form a compartment having an open top wherein the edge wall and outer rim define a bounded perimeter. The compartment is adapted to receive and hold the wafer. A liquid delivery conduit is associated with the wafer transport to deliver liquid to a position generally beneath the transport for moving the wafer between a first position resting on the abrading member and a second position in the cavity. The liquid delivery conduit has an outlet located above the abrading member.

In another aspect, a method of the present invention transfers a semiconductor wafer to or from a machine used to remove material from the wafer. The machine has a wafer carrier for holding the wafer and for guiding motion of the wafer relative to an underlying abrading member while a face of the wafer engages the abrading member. The wafer carrier includes at least one opening receiving the wafer, the opening having an outer rim that generally circumscribes a peripheral edge margin of the wafer. The method comprises the steps of placing a wafer transport over the wafer carrier in aligned registration wherein an open cavity of the wafer transport is positioned above the opening and an edge wall of the cavity is above the outer rim of the opening. The wafer transport and wafer carrier together form a compartment for containing the wafer. A liquid is delivered through a passage having an outlet located above the abrading member to a position beneath the wafer thereby moving the wafer in the compartment between a first position resting on the abrading member and a second position spaced above the abrading member.

Other objects and features of the present invention will be in part apparent and in part pointed out hereinafter.

BRIEF DESCRIPTION OF THE SEVERAL VIEWS OF THE DRAWINGS

Corresponding reference characters indicate corresponding parts throughout the views of the drawings.

DETAILED DESCRIPTION OF THE INVENTION

Figure 1:
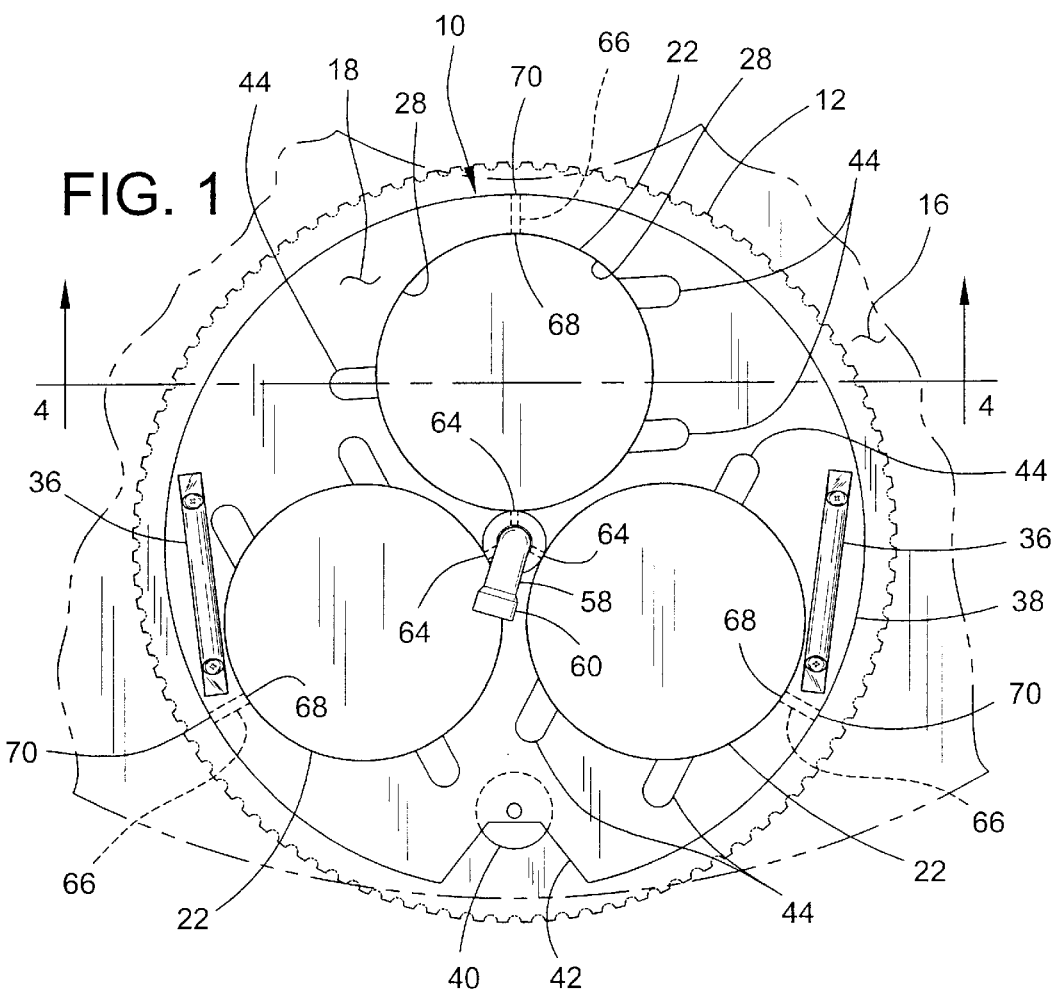
FIG. 1 is a top plan view of a wafer transport according to the present invention positioned on a wafer carrier of a wafer processing machine.
Figure 2:
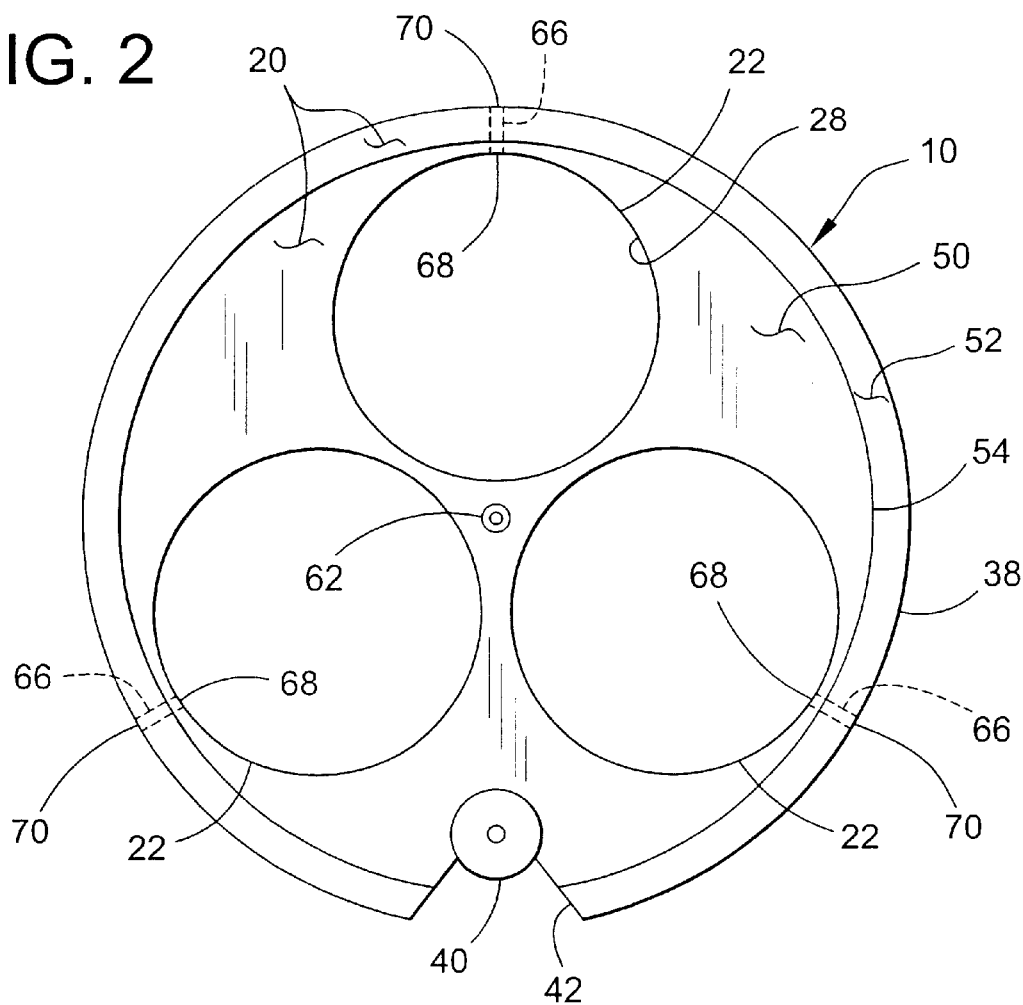
FIG. 2 is a bottom plan view of the wafer transport.
Figure 3:
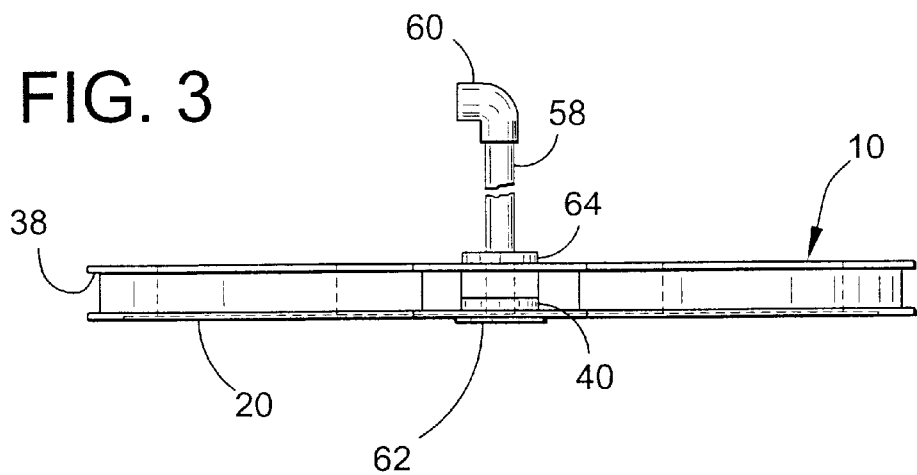
FIG. 3 is an elevation of the wafer transport.

Referring now to the drawings and in particular to FIGS. 1–3, a wafer transport according to the present invention for facilitating placement of a semiconductor wafer into or out of a polishing or lapping machine is indicated generally at 10. During operation of the machine, a wafer carrier 12 of the machine holds wafers and guides motion of the wafers relative to an underlying, rotating abrading member 16, such as a polishing pad, lapping plate, or grinding wheel while a face of each wafer engages the abrading member. The transport 10 is adapted for placement directly above the carrier 12 of the machine when it is not operating. A top surface 18 and a bottom surface 20 are generally flat, whereby the transport 10 may stably rest upon a generally flat upper surface of the wafer carrier 12.

Figure 8:
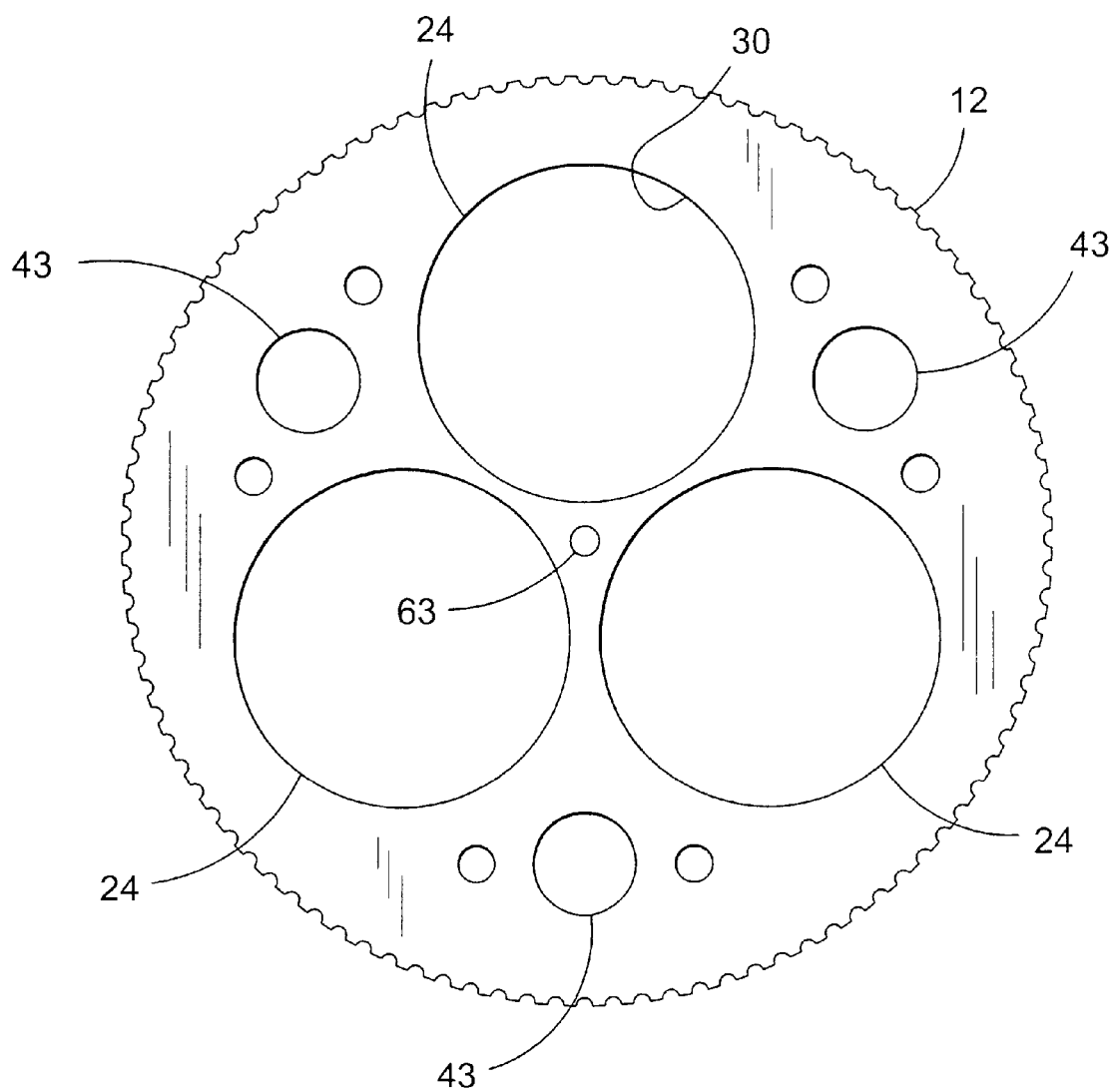
FIG. 8 is a top plan view of the wafer carrier of the wafer processing machine.

The wafer transport 10 has at least one cavity 22 extending through the transport from the top surface 18 to the bottom surface 20 and configured for placement directly above an opening 24 (FIG. 8) in the wafer carrier 12 in registering alignment. Preferably, the transport has three cavities 22 in a generally triangular arrangement for placement directly over three corresponding openings 24 of the wafer carrier 12 in alignment therewith. It is understood that the transport 10 may have any number of cavities 22 for receiving any number of wafers without departing from the scope of the present invention. Each cavity 22 is typically circular in shape for receiving one circular wafer W and has a diameter approximately equal to a diameter of the opening 24 of the carrier, although other, non-circular shapes and non-equal diameters are possible.

The cavity 22 of the transport 10 and the opening 24 of the carrier 12 together form a cylindrical compartment indicated generally at 26 (FIG. 4) for limiting motion of wafer W. An internal edge wall 28 of the cavity is positioned above an outer rim 30 of each opening that generally circumscribes a peripheral edge margin of wafer W held therein. The compartment 26 has an open top and a bounded lateral perimeter defined by the edge wall 28 and the outer rim 30. The wafer transport 10 is adapted to contain the wafer W when the wafer is moved upwardly in the compartment 26 by action of a liquid beneath the wafer. The wafer W is movable between a first position 32 resting on the abrading member 16 and a second position 34 spaced above the abrading member where the wafer may be more readily removed from the machine. A thickness T of the transport 10 defines a height of the edge wall 28 which extends above the wafer carrier 12 in forming the compartment 26. In practice, the thickness T has been about 0.75 inch (19 mm), which provides a sufficiently tall compartment 26 and provides enough structural rigidity to prevent warp of the transport 10. Other dimensions do not depart from the scope of the invention.

Two handles 36 are attached to the top surface 18 of the transport 10 for manual movement and positioning of the transport by an operator. Alternatively, the operator may lift the transport by its outer edge 38. The transport 10 is constructed of a suitable material that is preferably rigid, lightweight, non-absorbent, non-reactive and hydrophobic. Materials that are effective include polytetrafluoroethylene (TEFLON) or a synthetic, polyetherimide resin (such as ULTEM).

An alignment member 40 is included on the bottom surface 20 of the transport as an aid for accurately aligning the transport so that the cavities 22 are in registering position over openings 24 of the carrier 12. As shown in FIGS. 1 and 2, the alignment member 40 is a circular shaped protuberance positioned in a notch 42 along the outer edge 38 of the transport. The alignment member 40 is sized and shaped to be received in a corresponding hole 43 in the carrier 12 so that an operator who is placing the transport 10 upon the carrier can quickly position the transport in accurate alignment with the carrier. As shown in FIG. 3, the alignment member 40 extends downwardly from the bottom surface 20 of the transport 10 a small distance, such as 0.025 inch (0.64 mm), so that it can engage and be secured in the carrier 12. Because the carrier 12 is typically 0.030 inch (0.76 mm) thick, the alignment member 40 will not extend completely through the carrier nor contact the underlying abrading member 16. However, it is understood that the alignment member 40 may be a marking or feature on the transport 10 that does not protrude from the transport and is aligned visually with a feature on the wafer carrier 12.

Access slots 44 are formed in the top surface 18 of the wafer transport 10 for providing access to a peripheral edge margin 46 of the wafer W for removal. The slots 44 are configured for receiving a manual gripping tool (not shown) to engage the edge 46 of the wafer W and lift the wafer from the machine without contacting a face of the wafer. There are three slots 44 per cavity 22, arranged so that extremities of a conventional three-point gripping tool (not shown) can be inserted in the slots for lifting the wafer W. There may be fewer or greater number of slots 44 and they may be arranged for receiving different types and orientations of gripping tools. Each of the slots 44 extends outwardly from the edge wall 28 (FIG. 1) and downwardly from the top surface 18 to a depth D (FIG. 4), to a position at or below the second position 34 of the wafer W such that when the wafer is at the second position, the peripheral edge margin 46 of the wafer faces the open slot and is accessible through the slot.

Figure 4:
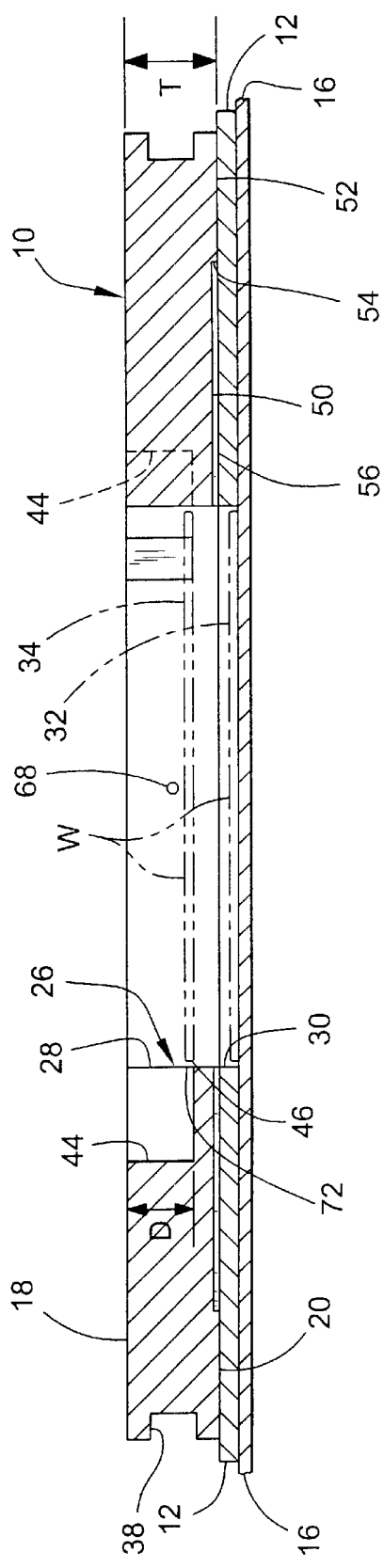
FIG. 4 is a section of the wafer transport, wafer carrier, and abrasive member of the machine taken on line 4—4 of FIG. 1.

The bottom surface 20 of the wafer transport 10 is formed to promote accumulation of liquid in the compartments 26 and inhibit dispersion of liquid away from the transport. The transport has a central portion 50 that is slightly recessed relative to an annular outer rim 52 (FIG. 2), with a ridge 54 formed at a boundary between the central portion and the rim. When the transport 10 is placed on the carrier 12, the outer rim 52 extends to a slightly lower elevation than the central portion 50 so that the outer rim directly engages the carrier and the central portion is spaced above the carrier by a very small gap 56 (FIG. 4). The outer rim 52 forms an effective seal against the underlying carrier 12 because the load path of the weight of the transport 10 is concentrated on the outer rim and flow of liquid outwardly between the transport and the carrier is inhibited. Instead, the liquid tends to accumulate in the compartments 26. In practice, the annular outer rim 52 has been about 1.0 inch (25 mm) wide and extends 0.005 inch (0.1 mm) lower than the central portion 50. Other dimensions do not depart from the scope of the invention.

The invention includes a conduit 58 for delivering liquid from a source of liquid (not shown) to a position beneath the transport 10. Significantly, the conduit 58 does not pass through the abrading member 16, but is located entirely above it. That feature provides the advantage that a polishing pad 16 can remain continuous, without being pierced or cut for passage of the conduit 58, to preclude damage and leaks. Moreover, a continuous polishing pad 16 can be re-conditioned for later use on other machines, while pads with one or more holes therein are of limited use. A further advantage is that the conduit 58 does not require any modification to the polishing or lapping machine. The conduit 58 is a tube which is centrally positioned in the transport 10 between the three cavities 22 and constructed of a suitable flexible material such as polypropylene. However, it is understood that the conduit 58 may be at any location on the transport 10 or may be detached from the transport, and it may have any material construction without departing from the scope of this invention.

The conduit 58 has an inlet comprising an upstream connector 60 for attachment to a source of liquid, the connector being located above the top surface 18 of the transport 10. A first, main outlet 62 of the conduit 58 is preferably located at a center of the bottom surface 20 of the transport. The outlet 62 preferably protrudes downwardly from the bottom surface 20 a small distance, such as 0.025 inch (0.64 mm), so that the outlet may be received in a center opening 63 of the carrier 12 as an additional aid in aligning and securing the transport 10 on the carrier. When the transport 10 is positioned on the carrier 12, the outlet 62 is positioned above the abrading member 16 at the center of the carrier so that liquid flowing out from the outlet is deposited on the abrading member at a location outside of any compartment 26. From the center, the liquid may freely flow radially outwardly on top of the abrading member 16 into the bottom of each compartment 26 to begin to fill each compartment. A portion of the liquid is typically absorbed in the abrading member 16, especially when the abrading member is a porous, absorbent polishing pad such that some liquid may flow inside the abrading member through its pores to reach the compartments 26.

The liquid delivery conduit preferably includes three secondary outlets 64 (FIG. 1) positioned on top of the transport 10 for selectively delivering liquid into the top of each of the three cavities 22. Liquid from the secondary outlets 64 is delivered to a position above a wafer W contained in the cavity 22 to increase weight pressing the wafer downwardly against the abrading member 16. A suitable valve system (not shown) is included for selectively changing the conduit 58 to deliver liquid through the main outlet 62 or secondary outlets 64.

An overflow channel 66 is formed in each cavity 22 of the wafer transport 10 for limiting a quantity of liquid within the compartment 26. The overflow channel 66 extends from an inlet 68 on the edge wall 28 of the cavity to an outlet 70 located outside of the cavity. The inlet 68 is positioned on the edge wall 28 so that when the transport 10 is placed above the carrier 12 and liquid is delivered into the compartment 26, any liquid in the compartment at an elevation above the inlet flows out of the compartment through the overflow channel 66, thereby limiting a quantity of liquid that may accumulate in the compartment to that below an elevation of the inlet. The inlet 68 of the overflow channel 66 is positioned at an elevation to approximately correspond with the second position 34 of the wafer.

In operation, the transport 10 may be used for either removing or inserting wafers to the wafer carrier 12 of the polishing or lapping machine. To remove wafers after a polishing process, the operator first swings an upper platen away (if the machine is a double side polisher having an upper platen for processing the upper face of the wafer). The wafers W are in their respective carriers at the first position 32, resting on the abrading member 16. The operator places the transport 10 into position on the carrier 12, lifting it by the handles 36 from a nearby location. The operator aligns the alignment member 40 so that it is in registration with a corresponding hole 43 in the carrier 12, and all three cavities 22 of the transport 10 are simultaneously aligned in registration with corresponding openings 24 in the carrier forming cylindrical compartments 26. The liquid delivery conduit 58 is connected to a source of high purity water or other liquid that flows through the conduit and out from the main outlet 62. The liquid is deposited onto the abrading member 16 at a location outside of any of the compartments 26, specifically at a center of the carrier 12 between the three compartments. Liquid naturally will flow outwardly away from the vicinity of the outlet 62. A portion of the liquid flows horizontally on top of the abrading member 16 and underneath the carrier 12. Liquid accumulates within each compartment 26. The ridge 54 on the bottom surface 20 tends to seal the engagement of the transport 10 against the carrier 12 and promote pooling of liquid in the compartments 26 and inhibit flow of liquid out away from the transport.

As liquid accumulates, the wafer W is lifted from the first position 32 to the second position 34. Although silicon wafers are not buoyant, they are driven upwardly much like a piston. Very little liquid may leak to a top face of the wafer W, through a gap 72 between a perimeter of the compartment 26 and edge of the wafer, because the gap is small. Preferably, the diameter of each cavity 22 exceeds a wafer diameter (typically 7.9 inches or 200.0 mm) by no more than 0.03 inch (0.8 mm) so that the gap 72 is generally less than 0.016 inch (0.4 mm) on each side of a wafer centered in the cavity. Further, as previously disclosed the material of the transport 10 is preferably hydrophobic, such as polytetrafluoroethylene or a synthetic, polyetherimide resin, which inhibits leakage through the gap.

When the wafer is at the second position 34, additional liquid flowing into the compartment 26 will not further raise the wafer but instead flows out through the overflow channels 66. The channels 66 are collectively sized to pass a quantity of liquid as large as the delivery conduit 58 so that liquid cannot rise above the inlets 68 of the overflow channels.

The wafers W may be manually removed using a conventional three point gripping tool (not shown). Extremities of the tool are inserted into the access slots 44 in the top surface 18 of the transport 10. The edges 46 of the wafer are accessible so that the tool can lift the wafer without contacting a face of the wafer.

For insertion of a wafer into the machine, the transport 10 is first placed on an. empty wafer carrier 12 in aligned position and a first quantity of liquid is delivered through the conduit 58 so that it accumulates in a pool formed in each compartment 26. The operator uses the gripping tool to place the wafer on the pool of liquid in the second position 34. The liquid is shut off and allowed to drain from beneath the transport 10 so that the wafer moves downwardly to the first position 32. Additionally, a suction or vacuum may be applied through the liquid delivery conduit 58 and the first outlet 62 to more rapidly remove the liquid from beneath the wafer. The conduit 58 can thus reverse its direction of flow and function as a vacuum device for removing liquid.

If the operator determines that it is necessary to improve the seat of the wafer W against the abrading member 16, valving of the liquid delivery conduit 58 is changed so that liquid is supplied and flows outwardly through the secondary outlets 64, delivering a second quantity of liquid to the top face of the wafer to provide additional weight on the wafer that presses all portions of the wafer downwardly against the abrading member. The quantity of liquid is sufficient that the added weight seats the wafer W on the abrading member 16 and precludes any need for the operator to press downwardly on the wafer with a finger or thumb. The weight of the liquid is evenly applied over the entire wafer, which avoids breakage. Next, the transport 10 is removed and the machine may begin operation.

In practice, the wafer transport 10 of the present invention permits a reduction of the time spent inserting and removing wafers from polishing and lapping machines relative to previous methods. A typical machine can process an additional 15 wafers per hour over a manual wafer handling technique with reduced damage to wafers. Moreover, the liquid delivery conduit 58 does not pass through the abrading member 16 so that continuity of the abrading member is maintained.

Figure 5:
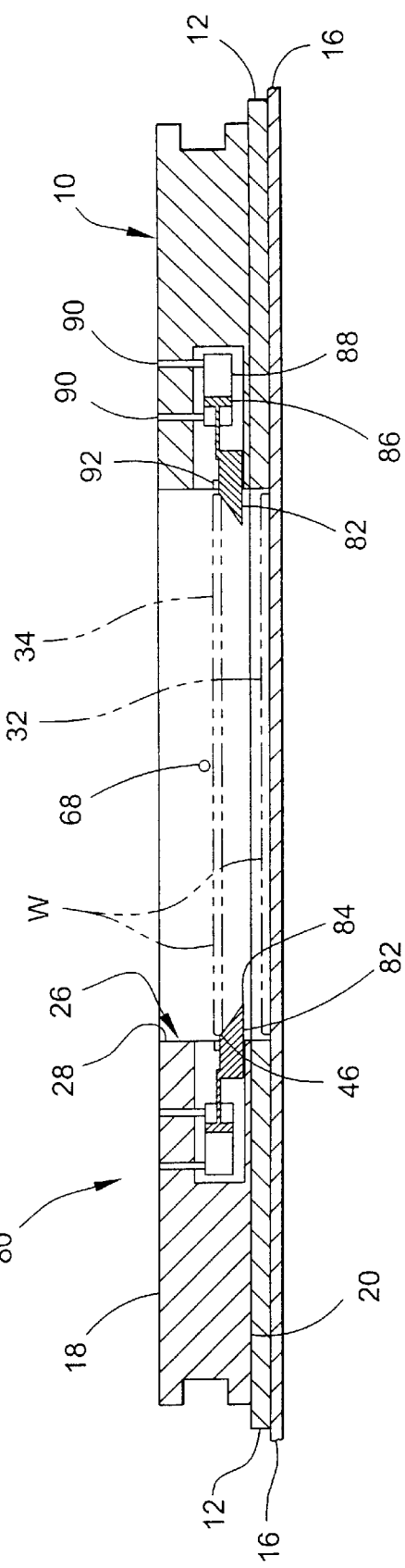
FIG. 5 is a schematic section similar to that of FIG. 4 of a second embodiment of the invention.

A second embodiment 80 of the invention having a moveable wafer support 82 mounted in the wafer transport 10 is shown in FIG. 5. The wafer support 82 is located at the edge wall 28 of the cavity 22 and positioned so that a tip 84 is at a lower elevation than the second position 34 of the wafer such that when the wafer is at the second position, the edge 46 of the wafer is higher than the tip. The wafer support 82 is moveable between a stowed position (not shown) wherein the wafer support is entirely outside of the compartment 26 and the wafer is free to move vertically, and a deployed position (shown in FIG. 5) wherein the wafer support protrudes from the edge wall 28 into the compartment and the wafer is prevented from moving below the second position 34. The wafer support 82 is configured to engage the edge 46 of the wafer to support the wafer for removal of the wafer from the machine without contacting a face of the wafer. Each wafer support 82 has a width between about 0.5 and 1.0 inch (13 and 25 mm) so that the weight of the wafer is not concentrated on a small, point contact that could more easily damage the wafer. Preferably, there are four wafer supports 82 spaced about the cavity 22 at about ninety degree intervals. Only three supports 82 are required to stably support a wafer, but a fourth is included in case one support does not properly deploy. It is understood that there could be a variety of sizes and numbers of wafer supports without departing from the scope of this invention.

The wafer supports 82 are actuated by a suitable apparatus, such as the pneumatic system shown in FIG. 5. Each wafer support 82 is attached to a piston 86 slidable in a cylinder 88. A source of a pressure vacuum (not shown) is connected through two air passages 90 to move the piston 86 and thereby to move the wafer support 82 between the stowed and deployed positions. When the wafer support 82 is used to hold a wafer, the transport of the second embodiment 80 may be used to carry the wafer into and out of position over a wafer carrier 12 of a processing machine. Access slots 44 are not necessary for the transport of the second embodiment 80 since wafers need not be accessible to a manual gripping tool. However, access slots 44 may be included for flexibility of use.

The transport of the second embodiment 80 includes a sensor 92 for detecting whether the wafer is at the second position 34 and thereby indicating readiness for moving the wafer supports 82 from the stowed position to the deployed position. The sensor 92 is of a conventional nature such as an optical or proximity sensor for monitoring wafer position. When the sensor 92 detects that the wafer is at the second position 34, the wafer supports 82 are deployed.

Figure 6:
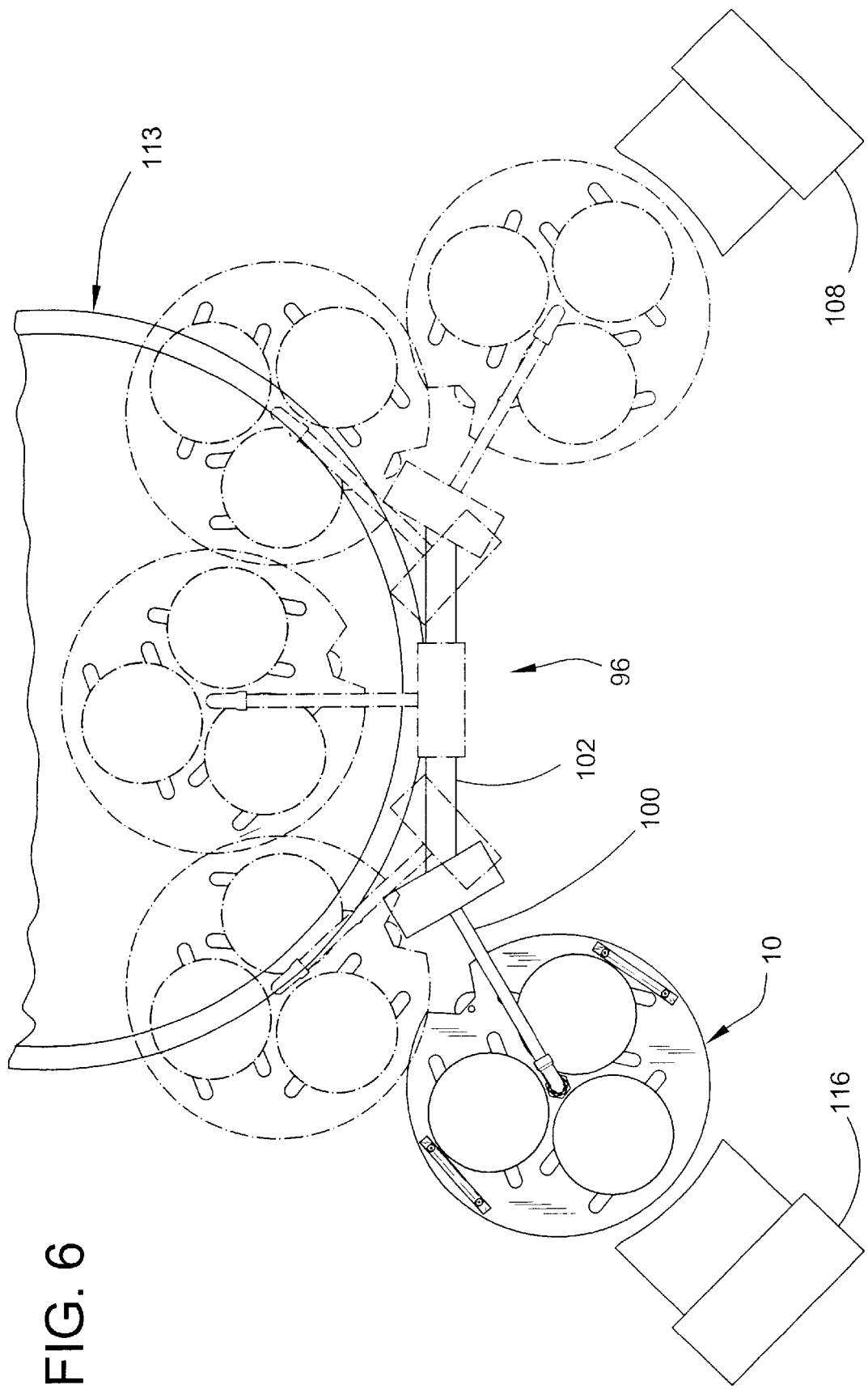
FIGS. 6 and 7 are schematic top plan views of an automated, robotic system for loading and unloading the machine with the wafer transport of the first or second embodiments.
Figure 7:
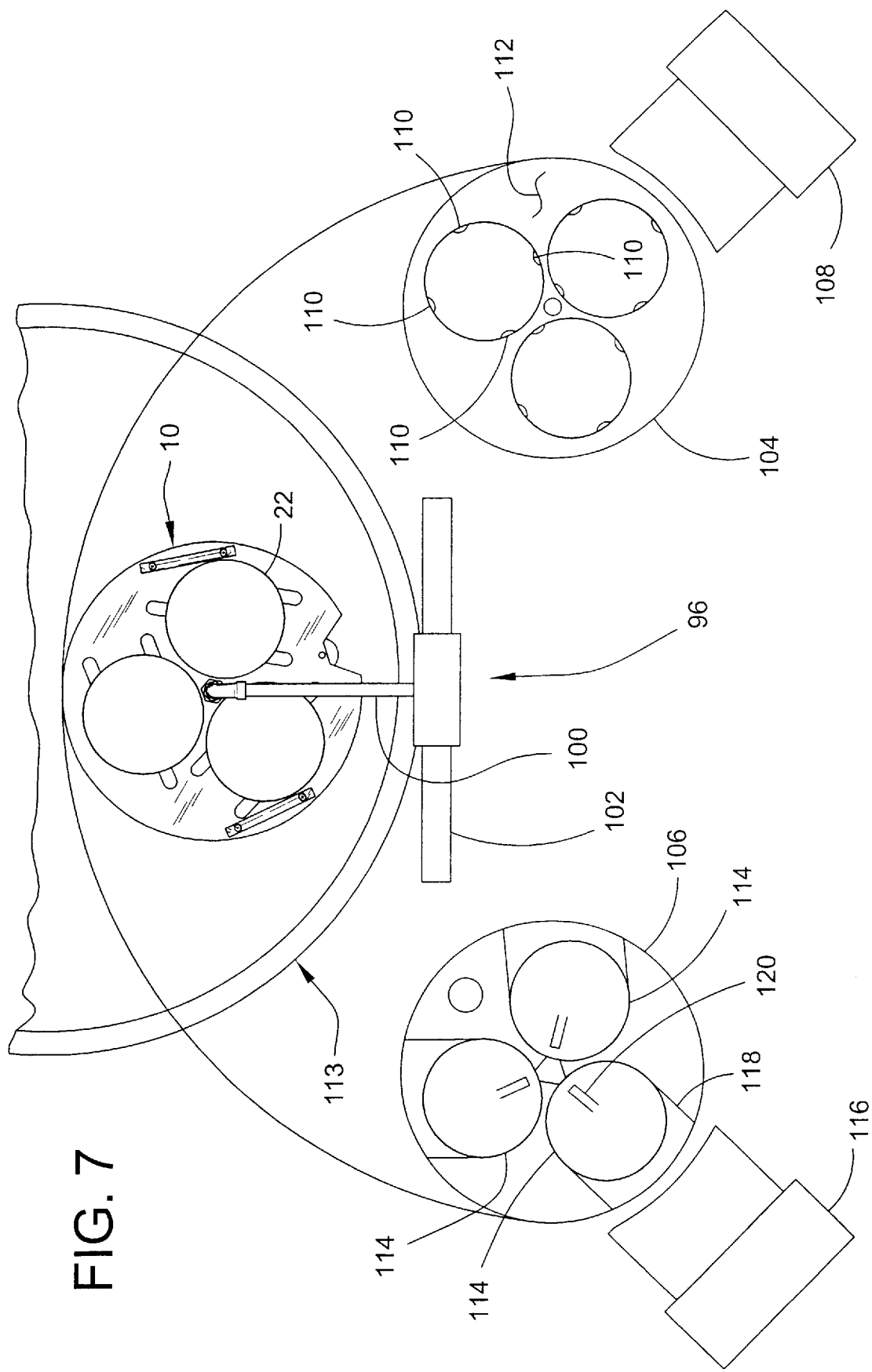

An automated robotic system for placing one or more wafers into and out of a machine according to the present invention is indicated generally at 96 in FIGS. 6 and 7. A support arm 100 is attached to the wafer transport 10 for moving the wafer transport into and out of position on the wafer carrier 12. The arm 100 is mechanized and controlled by a computer control unit and motor (not shown) for automated operation, being rotatable and moveable along a track 102 for selectively moving the transport 10 between a load turntable 104, the carrier 12 of the machine, and an unload turntable 106. The arm 100 can index (rotate) the transport 10. Though not shown on FIGS. 6 and 7, the arm 100 includes the liquid delivery conduit 58 thereon to deliver liquid to the transport 10.

In operation, the automated system of the second embodiment 80 begins when wafers W are initially transferred by a conventional robotic device (not shown) from a cassette 108 and placed on pedestals 110 of the load turntable 104. The pedestals 110 support each wafer, by its edge 46, in an elevated position above a surface 112 of the load turntable 104. The arm 100 moves the transport 10 into a location above the load turntable 104, with the cavities 22 positioned in registering alignment over the wafers. An automated visual system (not shown), such as a TV camera and processor with image recognition software, is used to accurately position the transport 10 in translation and rotation with the load turntable 104. A lapping application may require rinsing of the wafers and carrier to remove slurry and allow sufficient contrast for the image recognition software to determine the location of the wafer and carrier. The arm 100 lowers the transport so that the cavities 22 move down over the wafers. When the sensor 92 detects that the transport 10 is low enough relative to the wafers such that each wafer is at or above the second position 34 in its corresponding cavity 22, all wafer supports 82 are deployed. The transport 10 is then lifted which carries the wafers off the support pedestals 110, along with the transport. The robot arm 100 moves the transport 10 to the machine, indicated generally at 113, where the transport is lowered in aligned position resting on the wafer carrier.

Liquid is delivered through the liquid delivery conduit 58 (first outlet 62) until a pool of liquid is formed in each compartment 26. The wafer supports 82 are then retracted so that each wafer W is supported by the surface of the pool of liquid. Very little liquid may leak through the small gap 72, between the wafer and edge wall 28, to the top face of the wafer. Therefore, the wafer remains above the pool of liquid. Liquid delivery is halted and the pools gradually and naturally drain so that the wafers descend to the first position 32 resting on the abrading member 16. If needed, a suction may be applied through the first outlet 62 to hasten the removal of liquid. Next, liquid delivery resumes, but now through the secondary outlets 64 to deliver liquid to an upper face of each wafer. That increases weight so that an entire lower face of each wafer fully seats on the underlying abrading member 16. The transport 10 is removed and the wafer processing machine is operated normally to polish or lap the wafers.

Upon completion of machine operation, the transport 10 is returned to an aligned, resting position upon the wafer carrier 12. Liquid is delivered through the liquid delivery conduit 58 to the first outlet 62 so that the wafers are lifted by liquid from the first position 32 to the second position 34. When the sensor 92 signals that the wafer is at the second position 34, the wafer supports 82 are deployed. The transport 10 may then be lifted with the wafers carried therein and moved to the unload turntable 106. The wafer supports 82 are retracted so that each wafer descends into a wafer-shaped depression 114 in the unload turntable 106. The wafers may then be moved from the unload turntable 106 into a water tank or an unload cassette container 116 using a conventional system such as water track 118 and water nozzle 120.

The automated system of the second embodiment 80 is compatible with a clean room operation for the polishing or lapping machine. The support arm 100 is formed of plastic or other material that will not contaminate the wafers. Any metallic parts are encased in plastic. A barrier guard (not shown) made of a clear plastic material is provided to protect the operator from inadvertently contacting the arm.

In view of the above, it will be seen that the several objects of the invention are achieved and other advantageous results obtained.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A system for facilitating transfer of a semiconductor wafer into or out of a machine for removing material from said wafer, the machine having a wafer carrier for holding said wafer and for guiding motion of the wafer relative to an underlying abrading member while a face of the wafer engages said abrading member, the wafer carrier including at least one opening for receiving the wafer, the opening having an outer rim that generally circumscribes a peripheral edge margin of the wafer, the system comprising:

a wafer transport suitable for placement above said wafer carrier of the machine, the transport having a top surface, a bottom surface, and at least one open cavity therethrough with an internal edge wall, the cavity having a size and shape suitable for registering alignment with said at least one opening of the wafer carrier when the edge wall of the cavity is positioned above the outer rim of the opening and the bottom surface rests on the wafer carrier, the cavity and opening together forming a compartment having an open top wherein the edge wall and outer rim define a bounded perimeter, the compartment being adapted to receive and hold the wafer, and a liquid delivery conduit associated with the wafer transport to deliver liquid to a position generally beneath said transport for moving the wafer between a first position resting on the abrading member and a second position in the cavity, the liquid delivery conduit having an outlet located above said abrading member when the wafer transport is positioned above the carrier in the machine.

2. A system as set forth in claim 1 wherein said outlet of the liquid delivery conduit is positioned at the bottom surface of the wafer transport.

3. A system as set forth in claim 2 wherein said liquid delivery conduit extends through the wafer transport from the top surface to the bottom surface.

4. A system as set forth in claim 2 wherein said outlet of the liquid delivery conduit is positioned to deliver liquid to said abrading member at a location outside of said compartment.

5. A system as set forth in claim 4 wherein said outlet is located at a center of the transport.

6. A system as set forth in claim 1 wherein said cavity of the wafer transport has substantially the same size and shape as said opening in the wafer carrier.

7. A system as set forth in claim 1 further comprising a secondary outlet from said liquid delivery conduit, said secondary outlet positioned above said upper surface of the transport for delivering liquid onto a top face of the wafer when placed in the transport so as to increase weight and press the wafer downwardly to said first position against said abrading member.

8. A system as set forth in claim 1 further comprising at least one access slot in the top surface of the wafer transport for providing access to the peripheral edge margin of the wafer, said at least one access slot extending outwardly from the edge wall of the cavity and having a depth extending from said top surface down to or below a position corresponding with the second position of the wafer such that when the wafer is at the second position, the peripheral edge margin of the wafer faces the access slot and is thereby accessible through the slot for engaging the edge margin to hold the wafer in the cavity without contacting a face of the wafer.

9. A system as set forth in claim 8 wherein there are three access slots in the top surface of the wafer transport.

10. A system as set forth in claim 1 further comprising an overflow channel in the wafer transport for limiting a quantity of liquid within the compartment, the overflow channel extending from an inlet on the edge wall of said cavity to an outlet located outside of said cavity, the inlet being positioned on the edge wall so that when the wafer transport is placed above the wafer carrier and liquid is delivered into said compartment, any liquid in the compartment above the inlet flows out of the compartment through the overflow channel thereby limiting a maximum elevation of liquid that may accumulate in the compartment to an elevation of the inlet.

11. A system as set forth in claim 10 wherein the inlet of the overflow channel is positioned at an elevation corresponding to said second position of the wafer.

12. A system as set forth in claim 1 further comprising an alignment member on the wafer transport for positioning the wafer transport relative to the wafer carrier so that the cavity of the wafer transport is in registering alignment with the opening of the wafer carrier.

13. A system as set forth in claim 12 wherein said alignment member comprises a protuberance positioned along an outer rim of the wafer transport, the protuberance having a shape and size corresponding to a bore of the wafer carrier for aligning reception in the bore.

14. A system as set forth in claim 1 further comprising a moveable wafer support mounted in the wafer transport, the wafer support being located on the edge wall of the cavity below a position corresponding to the second position of the wafer such that when the wafer is at the second position, the peripheral edge margin of the wafer is higher than the wafer support, the wafer support being moveable between a stowed position wherein the wafer support is outside of the compartment and the wafer is free to move and a deployed position wherein the wafer support protrudes from the edge wall into the compartment and the wafer is prevented from moving below the wafer support, the wafer support configured to engage the edge of the wafer to support the wafer for removal of the wafer from said machine without contacting a face of the wafer.

15. A system as set forth in claim 14 wherein there are at least three wafer supports circumferentially spaced about the edge wall of the cavity.

16. A system as set forth in claim 14 further comprising a sensor for detecting whether the wafer is at the second position and thereby indicating readiness for moving the wafer support from the stowed position to the deployed position.

17. A system as set forth in claim 14 further comprising a support arm attached to the wafer transport for moving the wafer transport into or out of position above the wafer carrier.

18. A system as set forth in claim 1 in combination with the material removal machine.

19. A method for transferring a semiconductor wafer to or from a machine used to remove material from said wafer, the machine having a wafer carrier for holding said wafer and for guiding motion of the wafer relative to an underlying abrading member while a face of the wafer engages said abrading member, the wafer carrier including at least one opening receiving the wafer, the opening having an outer rim that generally circumscribes a peripheral edge margin of the wafer, the method comprising the steps of:

placing a wafer transport over the wafer carrier in aligned registration wherein an open cavity of the wafer transport is positioned above said opening and an edge wall of the cavity is above said outer rim of the opening, the wafer transport and wafer carrier together forming a compartment for containing the wafer; and delivering a liquid through a passage having an outlet located above said abrading member thereby moving the wafer in the compartment between a first position resting on said abrading member and a second position spaced above said abrading member.

20. A method as set forth in claim 19 further comprising the step of engaging the edge of the wafer with a support tool for holding the wafer in the wafer transport without contacting a face of the wafer.

21. A method as set forth in claim 20 wherein the step of engaging the edge of the wafer with a support tool comprises placing extremities of a manual gripping tool through access slots on the wafer transport from where the edge of the wafer is accessible, engaging the extremities against the wafer edge, and lifting the gripping tool with the wafer held by its edge.

22. A method as set forth in claim 20 wherein the step of engaging the edge of the wafer with a support tool further comprises deploying a moveable wafer support from the edge wall of the cavity, the wafer support being positioned beneath the edge of the wafer when the wafer is at the second position and being adapted to support the wafer by the edge for removal from the machine.

23. A method as set forth in claim 22 further comprising a step, before the step of engaging the edge of the wafer, of monitoring whether a height of the wafer in the compartment has reached an elevation of said second position.

24. A method as set forth in claim 22 further comprising a step of lifting the wafer transport from the wafer carrier for removal of wafers therefrom.

25. A method as set forth in claim 19 further comprising a step of limiting a quantity of liquid in said compartment.

26. A method as set forth in claim 19 further comprising steps, prior to said step of placing the wafer transport over the wafer carrier, of:

placing the wafer transport adjacent to a wafer loading station at a position suitable for transferring a wafer therebetween; and transferring the wafer from the loading station to the cavity of the transport.

27. A method as set forth in claim 26 wherein said step of delivering liquid through a passage comprises moving the wafer from the second position in the cavity of the wafer transport downwardly to the first position in contact with the abrading member by lowering the level of liquid under the wafer, and wherein the method further comprises the steps of:

operating the machine to thereby polish or lap the wafer;

returning the transport to said aligned registration position over the wafer carrier;

delivering a liquid to a position beneath the wafer so that the wafer is moved upwardly by action of the liquid from a first position resting on said abrading member to a second position spaced above said abrading member;

placing a support beneath the wafer to hold the wafer at said second position in the transport;

moving the transport to an unloading station; and transferring the wafer from the transport to the unloading station.

28. A method as set forth in claim 27 wherein the step of delivering liquid through a passage includes delivering liquid to an upper face of the wafer whereby weight of the liquid presses the wafer downwardly so that a lower face of the wafer engages the abrading member.

29. A method as set forth in claim 26 wherein three wafers are simultaneously moved on the transport.

* * * * *